(12) United States Patent
Kim

(10) Patent No.: US 8,604,585 B2
(45) Date of Patent: Dec. 10, 2013

(54) FUSE OF SEMICONDUCTOR DEVICE AND METHOD FOR FABRICATING THE SAME

(75) Inventor: Buem-Suck Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 51 days.

(21) Appl. No.: 12/824,572

(22) Filed: Jun. 28, 2010

(65) Prior Publication Data

US 2011/0001212 A1  Jan. 6, 2011

(30) Foreign Application Priority Data

Jul. 2, 2009 (KR) .................. 10-2009-0060312

(51) Int. Cl.
*H01L 23/52* (2006.01)
*H01L 29/00* (2006.01)

(52) U.S. Cl.
USPC .............. 257/529; 257/536; 257/E29.001

(58) Field of Classification Search
USPC ............... 257/529, E21.592, E23.149, 536
See application file for complete search history.

(56) References Cited

U.S. PATENT DOCUMENTS

| | | | |
|---|---|---|---|
| 3,236,976 A * | 2/1966 | Rayno | 337/292 |
| 6,731,005 B2 * | 5/2004 | Koyama et al. | 257/758 |
| 2007/0170545 A1 * | 7/2007 | Kang et al. | 257/530 |
| 2009/0039463 A1 * | 2/2009 | Kang | 257/529 |
| 2009/0317968 A1 * | 12/2009 | Nagata | 438/600 |
| 2010/0025819 A1 * | 2/2010 | Domenicucci et al. | 257/536 |

FOREIGN PATENT DOCUMENTS

| | | |
|---|---|---|
| JP | 2005-191174 | 7/2005 |
| KR | 1020070076282 | 7/2007 |
| KR | 1020080069426 | 7/2008 |

OTHER PUBLICATIONS

Notice of Preliminary Rejection issued from Korean Intellectual Property Office on Feb. 18, 2011.
Notice of Allowance issued by the Korean Intellectual Property Office on Jul. 24, 2013.

* cited by examiner

*Primary Examiner* — Walter H Swanson
*Assistant Examiner* — Wilner Jean Baptiste
(74) *Attorney, Agent, or Firm* — IP & T Group LLP

(57) ABSTRACT

A fuse of a semiconductor device includes a plurality of first conductive patterns, and a plurality of second conductive patterns filling spaces between the first conductive patterns and formed of a material which has a greater specific resistance than the first conductive patterns.

10 Claims, 5 Drawing Sheets

FUSE OF SEMICONDUCTOR DEVICE AND METHOD FOR FABRICATING THE SAME

CROSS-REFERENCE TO RELATED APPLICATIONS

The present application claims priority of Korean Patent Application No. 10-2009-0060312; filed on Jul. 2, 2009, which is incorporated herein by reference in its entirety.

BACKGROUND OF THE INVENTION

Exemplary embodiments of the present invention relate to a semiconductor device, and more particularly, to a fuse of a semiconductor device and a method for fabricating the same, which can substantially prevent the failure of a repair fuse.

In a semiconductor memory device, if any one of a number of cells fails, the semiconductor memory device cannot properly function as a memory device, and therefore, is labeled as a bad product. However, if the entire semiconductor memory device is discarded because it is a bad product, even though a fail only occurs in a certain cell of the semiconductor memory device, an inefficient manufacturing yield results. Therefore, attempts have been made to improve the manufacturing yield by conducting a repair process in which a bad cell is replaced with a redundancy cell provided in advance in the semiconductor memory device, so that the entire semiconductor memory device can be restored to life. In order to replace the bad cell with the redundancy cell, the semiconductor memory device may have fuses. The repair process may be conducted through fuse blowing in which the fuse connected to the bad cell is cut by irradiating laser to the fuse.

FIGS. 1A through 1C are views illustrating a conventional fuse of a semiconductor device, wherein FIG. 1A is a plan view, FIG. 1B is a cross-sectional view taken along the line I-I' of FIG. 1A, and FIG. 1C is a cross-sectional view taken along the line II-II' of FIG. 1A, showing a concern with the conventional fuse.

Describing a conventional fuse of a semiconductor device with reference to FIGS. 1A and 1B, a plurality of fuses 12 are formed on a substrate 11 having a predetermined structure, and a dielectric layer 14 which has a fuse box 15 is formed on the substrate 11 in such a way as to cover the fuses 12 while the fuse box 15 partially exposes the fuses 12 for a repair process.

In general, the fuses 12 are not formed through a separate process, and instead, portions of metal lines are used as the fuses 12. Recently, metal lines have been formed using copper (Cu), which has low specific resistance compared to aluminum (Al) or tungsten (W) and is therefore capable of improving signal transmission characteristics. Thus, the fuses 12 have also been formed by the metal lines formed of copper.

However, in the conventional art, as can be readily seen from FIG. 1C, a concern arises in that a repair fuse fail, in which a cut fuse 12 is electrically connected again (see the reference symbol 'A'), is likely to occur. More specifically, a repair fuse fail may occur as a result of test circumstances, including temperature, humidity, voltage, etc., applied during a test such as an HAST (high acceleration stress test) performed after the repair process. Thus, performing such tests on a fuse of the conventional art means the repair yield and the reliability of the semiconductor device can deteriorate.

In more detail regarding the occurrence of a repair fuse fail, a conductive oxide is formed as the sides of a cut fuse 12 (that is, a repair fuse 12 that is cut so that it can repair a bad cell) are oxidated under test circumstances in which a temperature and a humidity are regulated. The cut fuse 12 can be electrically connected again as the formed conductive oxide gradually grows. Also, as migration, such as EM (electro migration) or SM (stress migration), occurs in the cut fuse 12 under test circumstances in which a voltage or a temperature is regulated, the cut fuse 12 can be electrically connected again.

In particular, because the copper constituting the fuse 12 is highly reactive with oxygen, in comparison to tungsten and aluminum, and is a material having great ion mobility, a repair fuse fail is likely to occur frequently due to oxidation and migration.

SUMMARY OF THE INVENTION

Exemplary embodiments of the present invention are directed to a fuse of a semiconductor device and a method for fabricating the same, which can substantially prevent a cut fuse from being electrically connected again after a repair process.

In accordance with an exemplary embodiment of the present invention, a fuse of a semiconductor device includes a plurality of first conductive patterns, and a plurality of second conductive patterns filling spaces between the first conductive patterns and formed of a material which has a greater specific resistance than the first conductive patterns.

The first and second conductive patterns may be alternately joined with each other on the same line in an order of a first one of the first conductive patterns, a first one of the second conductive patterns, a second one of the first conductive patterns, a second one of the second conductive patterns, and a third one of the first conductive patterns.

The second conductive patterns may include a material which has lower reactivity with oxygen than the first conductive patterns.

The second conductive patterns may include a material which has lower ion mobility than the first conductive patterns.

The first and second conductive patterns may include metal layers.

The first conductive patterns may include a copper layer.

The second conductive patterns may include a tungsten layer.

The fuse may further include a capping layer covering the first and second conductive patterns.

The capping layer may include a nitride layer.

The fuse may include a dielectric layer covering a surface of a structure including the first and second conductive patterns, and defining a fuse box over a part of the first conductive pattern between the second conductive patterns.

In accordance with another exemplary embodiment of the present invention, a method for fabricating a fuse of a semiconductor device includes forming a plurality of first conductive patterns over a substrate, forming sacrificial patterns which fill spaces between the first conductive patterns, forming an interlayer dielectric layer which covers the first conductive patterns and the sacrificial patterns, etching selectively the interlayer dielectric layer and the sacrificial patterns to define a plurality of open areas which expose facing sidewalls of the first conductive patterns and portions of the substrate between the first conductive patterns, filling the open areas with a material, which has a greater specific resistance than the first conductive patterns, to form second conductive patterns, forming a protective layer over the second conductive patterns and the interlayer dielectric layer; and etching selectively the protective layer and the interlayer dielectric layer to define a fuse box over a part of the first conductive pattern between the second conductive patterns.

The first and second conductive patterns may be alternately joined with each other on the same line in an order of a first one of the first conductive patterns, a first one of the second conductive patterns, a second one of the first conductive patterns, a second one of the second conductive patterns, and a third one of the first conductive patterns. The second conductive patterns may be formed of a material which has lower reactivity with oxygen than the first conductive patterns.

The second conductive patterns may be formed of a material which has lower ion mobility than the first conductive patterns.

The first and second conductive patterns may include metal layers.

The first conductive patterns may include a copper layer.

The second conductive patterns may include a tungsten layer.

The open areas may have a hole shape.

The method, may further include forming a capping layer to cover the first conductive patterns and the sacrificial patterns, before forming the interlayer dielectric layer.

The method, may further include: forming a capping layer to cover exposed portions of the first conductive patterns, after defining the fuse box.

The capping layer may include a nitride layer.

In accordance with yet another exemplary embodiment of the present invention, a method for fabricating a fuse includes forming a plurality of first conductive patterns over a substrate, forming a plurality of second conductive patterns in line and between the plurality of first conductive patterns over the substrate, forming a capping layer covering a portion of the first conductive pattern between the second conductive patterns, and forming an interlayer dielectric layer over the substrate to define a fuse box over a portion of the capping layer and over a part of the first conductive pattern between the second conductive patterns.

DESCRIPTION OF SPECIFIC EMBODIMENTS

Figure 1A:
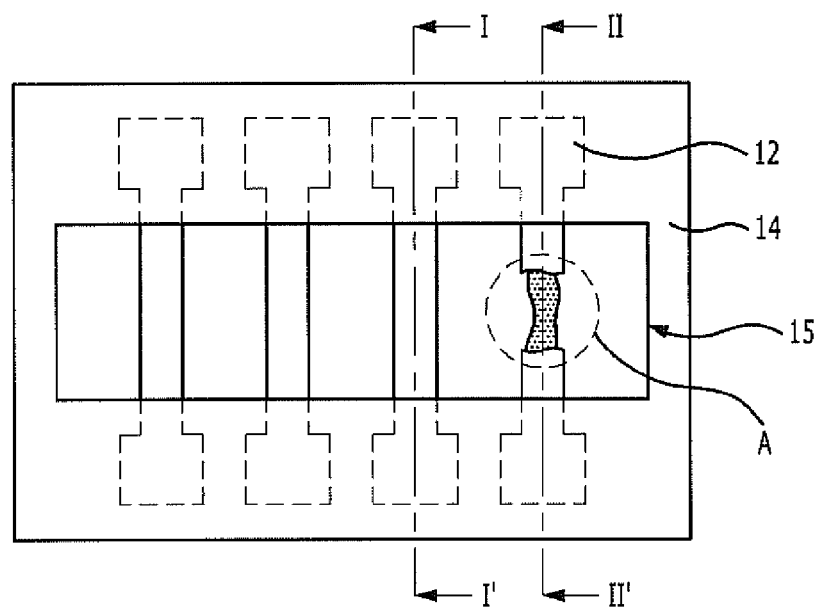
FIGS. 1A through 1C are views illustrating a conventional fuse of a semiconductor device.
Figure 1B:
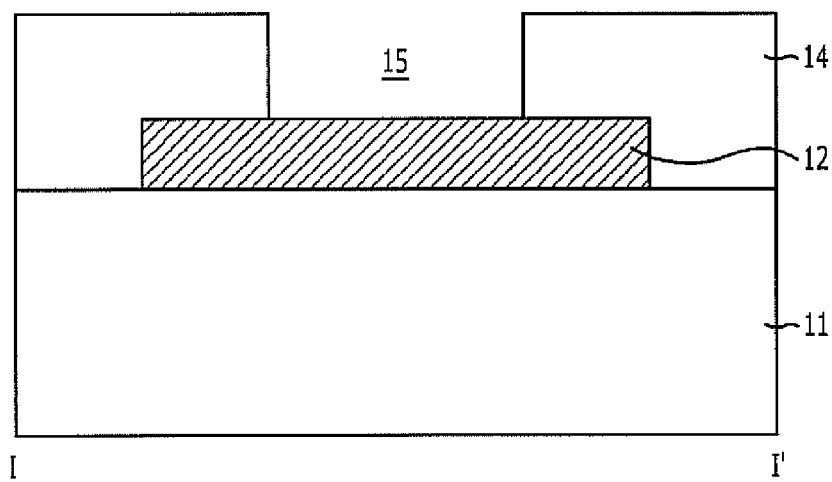
Figure 1C:
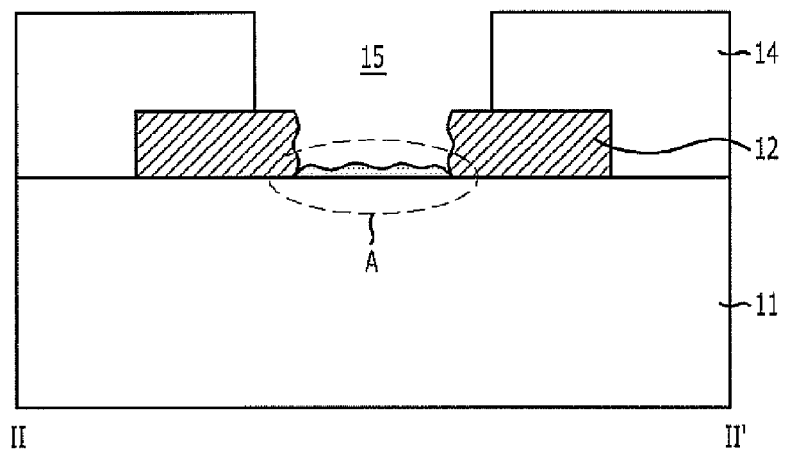

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Exemplary embodiments of the present invention which will be described below provide a fuse of a semiconductor device and a method for fabricating the same, which can substantially prevent a cut fuse (that is, a repair fuse) from being connected again in a is subsequent test after a repair process. To this end, a fuse is formed to have a structure in which first conductive patterns and second conductive patterns having different specific resistances are alternately joined with each other on the same line.

Figure 2A:
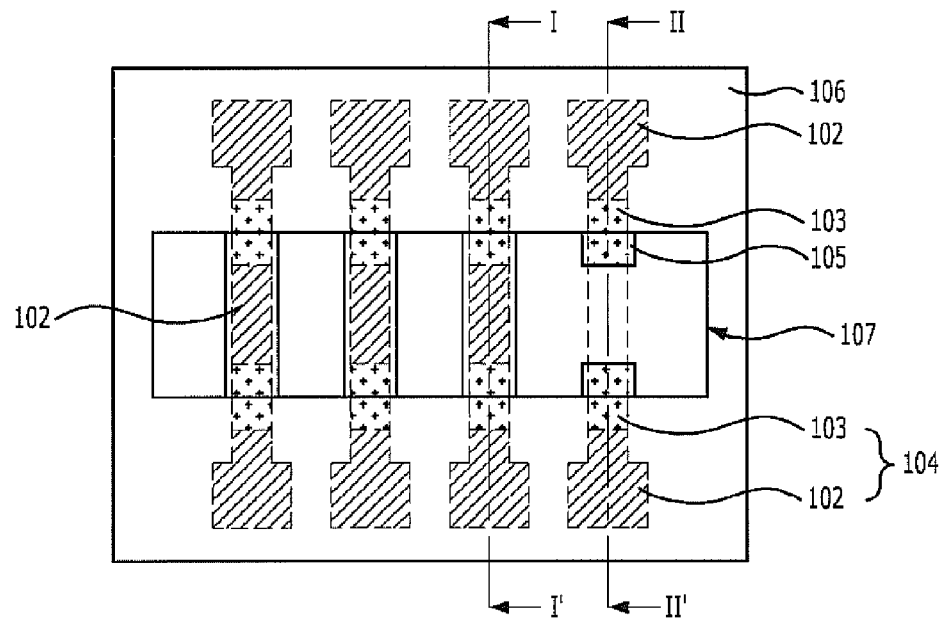
FIGS. 2A through 2C are views illustrating a fuse of a semiconductor device in accordance with an exemplary embodiment of the present invention.
Figure 2B:
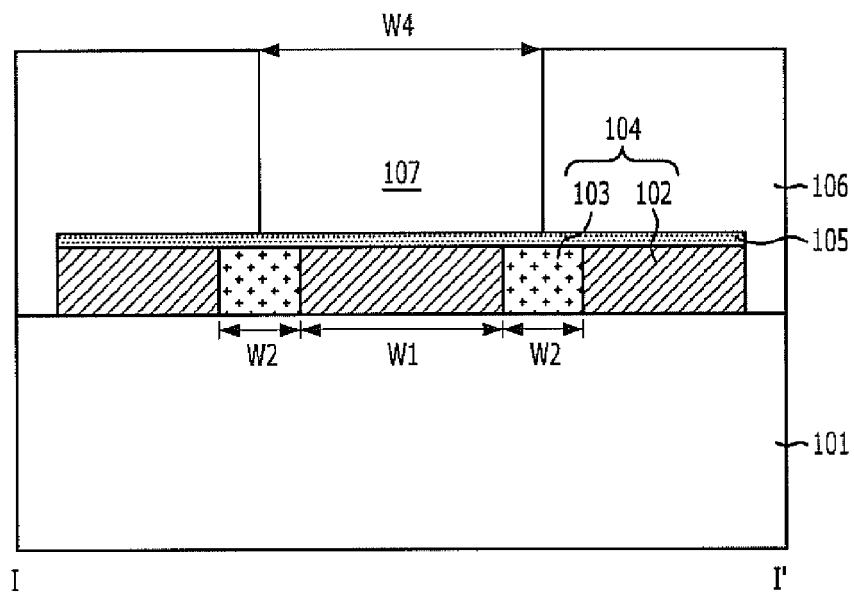
Figure 2C:
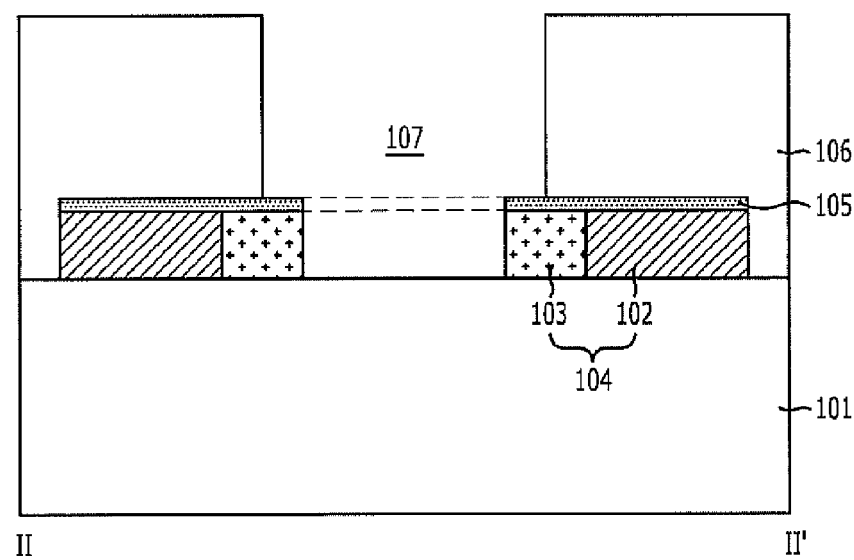

FIGS. 2A through 2C are views illustrating a fuse of a semiconductor device in accordance with an embodiment of the present invention, wherein FIG. 2A is a plan view, FIG. 2B is a cross-sectional view taken along the line I-I' of FIG. 2A, and FIG. 2C is a cross-sectional view taken along the line II-II' of FIG. 2A.

Referring to FIGS. 2A and 2B, a fuse of a semiconductor device in accordance with an exemplary embodiment of the present invention includes a conductive pattern 104. The conductive pattern 104 is composed of a plurality of first conductive patterns 102, which are formed on a substrate 101 having a predetermined structure, and a plurality of second conductive patterns 103, which fill the spaces between the first conductive patterns 102 and have a specific resistance greater than that of the first conductive patterns 102.

The fuse can further include a capping layer 105 which covers the conductive pattern 104, an dielectric layer 106 which covers the surface of the structure including the capping layer 105, and a fuse box 107 which is an opening in the dielectric layer 106 over a part of the first conductive pattern 102 present between the second conductive patterns 103.

The conductive pattern 104 composed of the first and second conductive patterns 102 and 103 actually serves as a fuse, and can include a line pattern in which the first conductive patterns 102 and the second conductive patterns 103 are alternately joined with each other.

In more detail, the conductive pattern 104 can have a shape in which the first and second conductive patterns 102 and 103 are alternately joined with each other in the order of the first conductive pattern 102, the second conductive pattern 103, the first conductive pattern 102, the second conductive pattern 103, and the first conductive pattern 102. The first conductive patterns 102, which are positioned at both ends of the conductive pattern 104, serve as pads for forming electrical connections with a structure (not shown) formed over or under the conductive pattern 104. The first conductive pattern 102, which is positioned between the second conductive patterns 103 and beneath the fuse box 107, serves as a region on which laser is irradiated during a repair process. The second conductive patterns 103, which are positioned between the first conductive patterns 102, function to prevent a cut fuse (that is, a repair fuse) from being electrically reconnected again after the repair process.

The first and second conductive patterns 102 and 103 can include metal layers. In more detail, the first conductive patterns 102, which are disposed in pad regions and a laser irradiation region, can include a copper layer which has a low specific resistance and is therefore capable of improving signal transmission characteristics. The second conductive patterns 103 have a specific resistance greater than the first conductive patterns 102, and thus, can include aluminum (Al), cobalt (Co), tungsten (W), titanium (Ti), tantalum (Ta), etc. It is most preferred that the second conductive patterns 103 be formed as a metal layer which has a greater specific resistance than the first conductive patterns 102, lower reactivity with oxygen than the first conductive patterns 102, and lower mobility (i.e., migration) than the first conductive patterns 102. Accordingly, it is most preferred that the second conductive patterns 103 be formed of tungsten, which satisfies these requirements.

The capping layer 105 which covers the conductive pattern 104 functions to protect the conductive pattern 104 during subsequent processes. In particular, the capping layer 105 functions to prevent the conductive pattern 104 from being exposed through the fuse box 107, and thus, from being oxidated or from being damaged by a shock induced due to blowing an adjoining fuse during a repair process or by conductive byproducts. It is preferred that the capping layer 105 functioning in this way includes a nitride layer. For example, a silicon nitride layer ($Si_3N_4$) may be the nitride layer that is used for the capping layer 105. In order to sufficiently protect the conductive pattern 104 during subsequent processes and be easily removed in the repair process, the capping layer 105 may have a thickness of approximately 1,000 Å to approximately 2,000 Å.

The dielectric layer 106, defining the fuse box 107, can include any one material selected from the group consisting of an oxide layer, a nitride layer, an oxynitride layer, an amorphous carbon layer, and polyimide, or can include a stack of two or more of these layers.

It is preferred that the fuse box 107 be defined to have a length that extends over at least a part of the first conductive pattern 102, which is between the second conductive patterns 103. In particular, it is preferred that the length W4 of the fuse box 107 be longer the length W1 of the first conductive pattern 102, which is between the second conductive patterns 103, and be shorter than the combined length (W1+2W2) of two second conductive patterns 103 and the conductive pattern 102 between them. As shown in FIG. 2B, the preferred lengths described above can be expressed by the following relationship: W1<W4<W1+2W2. Further, although FIG. 2B shows the length W2 of the second conductive patterns 103 to be the same, this does not have to be the case.

In the fuse according to the exemplary embodiment of the present invention, constructed as mentioned above, since the first and second conductive patterns 102 and 103 are composed of metal layers, normal circuit driving is enabled, and it is possible to substantially prevent a cut fuse from being electrically connected again in a test performed after the repair process. That is to say, a repair fuse fail can be substantially prevented due to the presence of the second conductive patterns 103. Hereafter, the repair process for the fuse according to an exemplary embodiment of the present invention, having the above-described construction, and a principle for substantially preventing the occurrence of a repair fuse fail will be described in detail.

First, describing the repair process using a fuse according to an exemplary embodiment of the present invention with reference to FIG. 2C, laser is irradiated on the conductive pattern 104. More specifically, laser is irradiated on the first conductive pattern 102, which is between the second conductive patterns 103, through the fuse box 107, so as to cut the fuse. The fuse is cut due to a difference in resistance between the first and second conductive patterns 102 and 103. When blowing the fuse by laser, electrons are concentrated on a laser irradiation area. That is, energy is transferred to the fuse by the laser, and thus, the fuse is cut as a result of the heat energy generated by the behavior of the concentrated electrons.

Due to the fact that the energy concentrated on the conductive pattern 104 is concentrated more on the first conductive pattern 102 formed of the material having a low specific resistance than on the second conductive patterns 103, the loss of the second conductive patterns 103 can be minimized, while the first conductive pattern 102, which is between the second conductive patterns 103, can be cut (or removed). At this time, the capping layer 105, which covers the first conductive pattern 102, is simultaneously removed when the first conductive pattern 102 is removed.

Next, a principle of substantially preventing the occurrence of the repair fuse fail in which the cut fuse is electrically connected again after the repair process will be described below.

The other first conductive patterns 102 (i.e., the first conductive patterns 102 forming the ends of a conductive pattern 104) composed of the copper layer and remaining after the repair process are not exposed due to the presence of the second conductive patterns 103. Rather, only the sidewalls of the second conductive patterns 103 are exposed. Accordingly, the second conductive patterns 103 serve as barrier layers for the first conductive patterns 102 under test circumstances in which a temperature and a humidity are regulated, to prevent the first conductive patterns 102 from reacting with oxygen. Thus, it is possible to prevent the occurrence of a repair fuse fail due to the oxidation of the remaining first conductive patterns 102. Furthermore, because the second conductive patterns 103 are formed of a material having lower reactivity with oxygen than the first conductive patterns 102, it is also possible to prevent the occurrence of the repair fuse fail due to the oxidation of the second conductive patterns 103.

Moreover, the second conductive patterns 103 serve as barrier layers for preventing the movement of the ions of the material (e.g., copper) constituting the first conductive patterns 102, under test circumstances in which a voltage or a temperature is regulated. Thus, it is possible to prevent the occurrence of the repair fuse fail due to migration, such as EM (electro migration) or SM (stress migration), of the remaining first conductive patterns 102. In addition, because the second conductive patterns 103 are formed of a material having lower ion mobility than the first conductive patterns 102, it is possible to prevent the occurrence of the repair fuse fail due to the migration of the second conductive patterns 103.

Consequently, since the fuse in accordance with an exemplary embodiment of the present invention has a structure in which the first and second conductive patterns 102 and 103, having different specific resistances, are alternately joined with each other, it is possible to prevent the occurrence of a repair fuse fail in a test performed after the repair process.

FIGS. 3A through 3D are cross-sectional views illustrating the processes of a method for fabricating a fuse of a semiconductor device in accordance with an exemplary embodiment of the present invention. Herein, for example, a method for fabricating a fuse of a semiconductor device, where the semiconductor device has a TLM (triple layer of metal) structure, including first, second, and third metal lines, and the second metal lines are used as fuses, is described.

Figure 3A:
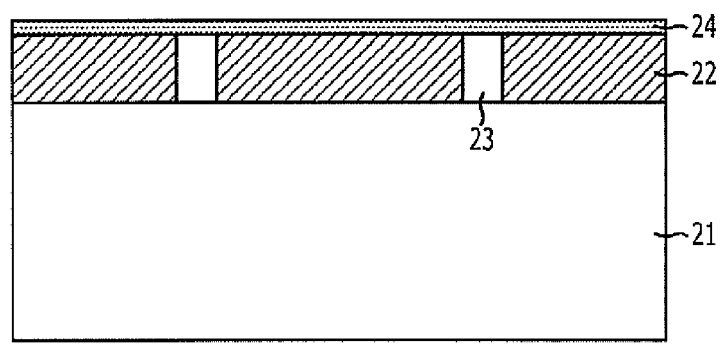
FIGS. 3A through 3D are cross-sectional views illustrating the processes of a method for fabricating a fuse of a semiconductor device in accordance with an exemplary embodiment of the present invention.

Referring to FIG. 3A, first conductive patterns 22 are formed on a substrate 21, which is formed with a predetermined structure, such that the first conductive patterns 22 are spaced apart from one another by a certain distance on the same line. The first conductive patterns 22 can be formed as a metal layer. The metal layer can be a copper layer which has a low specific resistance, and therefore, can improve signal transmission characteristics.

The first conductive patterns may be formed in a number of ways. For example, the first conductive patterns 22 can be formed through a series of processes of forming a dielectric layer (not shown) having damascene patterns over the substrate 21, and filling the copper layer in the damascene patterns. Alternatively, the first conductive patterns 22 can be formed by etching the substrate 21, and filling the copper layer in the etched substrate 21.

Sacrificial patterns 23 are formed to fill the spaces between the first conductive patterns 22. The sacrificial patterns 23 can be formed as an oxide layer. The sacrificial patterns 23 can be formed from the dielectric layer having the damascene patterns used to form the first conductive patterns 22. Alternatively, the sacrificial patterns 23 can be formed by forming spaces between the conductive patterns 22, and then filling the spaces with the sacrificial patterns 23.

A capping layer 24 is formed to cover the first conductive patterns 22 and the sacrificial patterns 23. The capping layer 24 functions to protect the first conductive patterns 22 during subsequent processes. Further the capping layer 24 can be a nitride layer, such as, for example, a silicon nitride layer. In order for the capping layer 24 to sufficiently protect the first conductive patterns 22, and be removed in a repair process, it is preferred that the capping is layer 24 is formed to have a thickness of approximately 1,000 Å to approximately 2,000 Å.

Figure 3B:
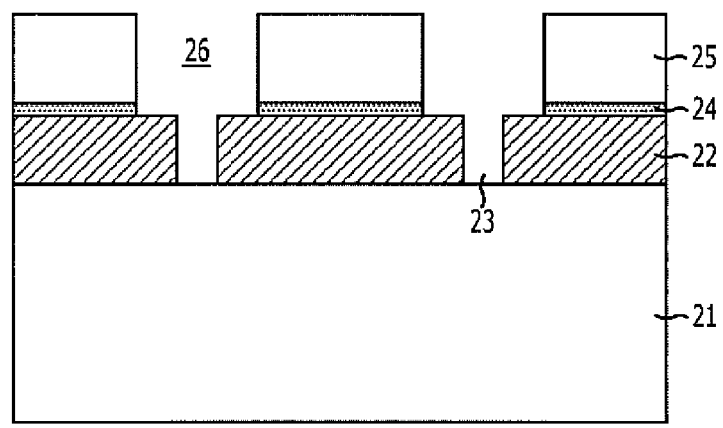

Referring to FIG. 3B, an interlayer dielectric layer 25 is formed over the resultant structure including first conductive patterns 22, the sacrificial patterns 23, and the capping layer 24. The interlayer dielectric layer 25 may be an IMD (inter metal layer) for insulation between metal lines, and can be formed from an oxide layer.

Photoresist patterns (not shown) may be formed on the interlayer dielectric layer 25. Using the photoresist patterns as etch barriers, a plurality of open areas 26 may be formed by sequentially etching the interlayer dielectric layer 25, the capping layer 24, and the sacrificial patterns 23. The plurality of open areas 26 are defined in such a way as to expose facing sidewalls of the first conductive patterns 22 and portions of the substrate 21 between the first conductive patterns 22.

In order to simplify a processing procedure, the open areas 26 can be simultaneously formed during a contact hole forming process for forming contact plugs between metal lines to be formed on the interlayer dielectric layer 25 (e.g., third metal lines) and metal lines formed on the same plane as the first conductive patterns 22 (e.g., second metal lines). Therefore, the open areas 26 can have a hole shape. In other words, for example, the open areas 26 may form hole within the interlayer dielectric layer 25.

Figure 3C:
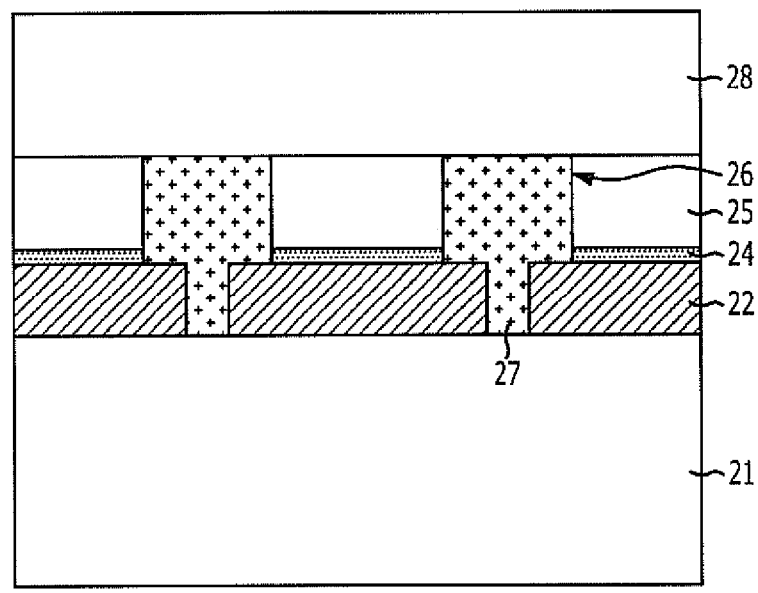

Referring to FIG. 3C, after forming a barrier metal layer (not shown) along the surface of the resultant structure including the open areas 26, a conductive material is deposited on the barrier metal layer in such a way as to fill the open areas 26. The barrier metal layer can include a stack layer in which a tantalum (Ta) layer and a tantalum nitride (TaN) layer are stacked.

By conducting a planarization process in such a way as to expose the upper surface of the interlayer dielectric layer 25, second contact patterns 27 which fill the open areas 26 are formed. The planarization process can be conducted through CMP (chemical mechanical polishing).

The second conductive patterns 27 can be formed as a metal layer. It is preferred that the second conductive patterns 27 be formed of a material having a specific resistance greater than that of the first conductive patterns 22. Thus, the second conductive patterns 27 may be formed of aluminum (Al), cobalt (Co), tungsten (W), titanium (Ti), tantalum (Ta), etc., which have a specific resistance greater than the copper layer. Further, it is preferred that the second conductive patterns 27 be formed of a metal layer which has a greater specific resistance than the first conductive patterns 22, lower reactivity with oxygen than the first conductive patterns 22, and lower mobility than the first conductive patterns 22. Accordingly, it is preferred that the second conductive patterns 27 be formed of tungsten which satisfies these requirements.

The second conductive patterns 27 can be formed together with the contact plugs, which are formed between the metal lines to be formed on the interlayer dielectric layer 25 (that is, the third metal lines) and the metal lines formed on the same plane as the first conductive patterns 22 (that is, the second metal lines).

After forming the uppermost metal lines (not shown) on the interlayer dielectric layer 25, a protective layer 28 is formed to cover the surface of the resultant structure. The protective layer 28 can be formed as a single layer including any one selected from the group consisting of an oxide layer, a nitride layer, an oxynitride layer, an amorphous carbon layer, and polyimide, or as a stack layer of two or more of these layers.

Figure 3D:
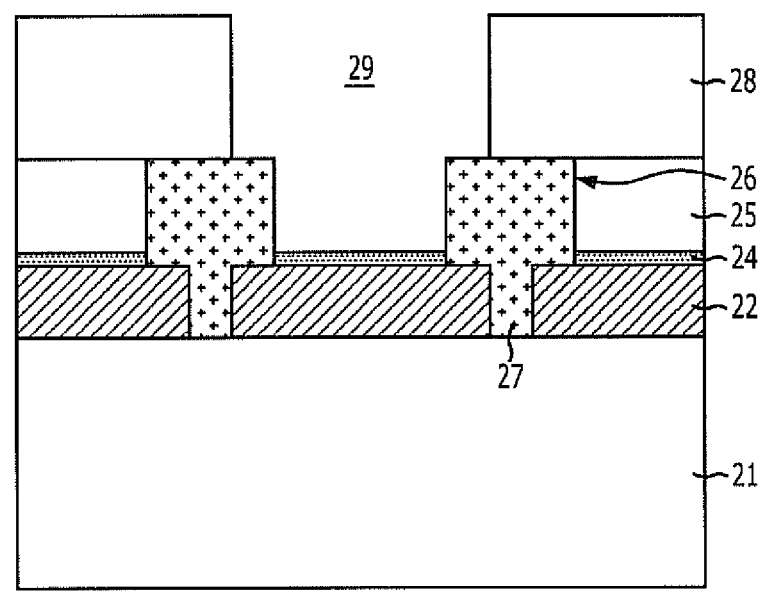

Referring to FIG. 3D, a fuse box 29 is formed by selectively etching the protective layer 28 and the interlayer dielectric layer 25. The fuse box 29 is defined in such a way as to expose the capping layer 24 present on the first conductive pattern 22 between the second conductive patterns 27. At this time, the second conductive patterns 27 on both sides of the first conductive pattern 22 can be partially exposed.

In the method for fabricating a fuse of a semiconductor device in accordance with an exemplary embodiment of the present invention, because the capping layer 24 is formed before forming the second conductive patterns 27, the capping layer 24 does not remain on the second conductive patterns 27 which may be exposed when forming the fuse box 29. Accordingly, it is conceivable in another exemplary embodiment of the present invention that the capping layer 24 is not formed in advance, and instead, is formed by depositing a dielectric layer (for example, a nitride layer) over the resultant structure, including the second conductive patterns 27, after the process of forming the fuse box 29 is completed. In this case, the surfaces of the first and second conductive patterns 22 and 27 exposed by the fuse box 29 can be protected by the capping layer 24.

Through the above-described method of fabrication, in accordance with the an exemplary embodiment of the present invention, a fuse can be formed to have a structure in which the first and second conductive patterns 22 and 27 are alternately joined with each other on the same line. More specifically, a fuse may be formed to have a structure in which the first and second conductive patterns 22 and 27 are alternately joined with each other in the order of the first conductive pattern 22, the second conductive pattern 27, the first conductive pattern 22, the second conductive pattern 27, and the first conductive pattern 22. In the fuse fabricated as described above, due to the formation of the second conductive patterns 27, it is possible to substantially prevent the occurrence of a repair fuse fail in which a cut fuse is electrically connected again as a result of a test performed after the repair process.

As is apparent from the above description, since a fuse has a structure in which first and second conductive patterns, having different specific resistances, are alternately joined with each other, normal circuit driving is enabled, and it is possible to substantially prevent the occurrence of a repair fuse fail in which a cut fuse is electrically connected again as a result of a test performed after a repair process.

While the present invention has been described with respect to the specific embodiments, it will be apparent to those skilled in the art that various changes and modifications may be made without departing from the spirit and scope of the invention as defined in the following claims.

What is claimed is:

1. A fuse of a semiconductor device, the fuse comprising:
a plurality of first conductive patterns; and
a plurality of second conductive patterns filling spaces between the plurality of first conductive patterns and formed a material that has a greater resistance than a material of the plurality of first conductive patterns,
wherein the plurality of first conductive patterns and the plurality of second conductive patterns are alternately connected with each other to form a line pattern acting as the fuse,
wherein a middle portion of the line pattern has smaller width than both end portions of the line pattern, and the middle portion of the line pattern includes at least two second conductive patterns, of the plurality of second conductive patterns, and at least one first conductive pattern, of the plurality of first conductive patterns, between the at least two second conductive patterns.

2. The fuse of claim 1, wherein the plurality of first conductive patterns and the plurality of second conductive patterns are alternately joined with each other on the line pattern in an order of a first one of the plurality of first conductive patterns, a first one of the plurality of second conductive patterns, a second one of the plurality of first conductive patterns, a second one of the plurality of second conductive patterns, and a third one of the plurality of first conductive patterns.

3. The fuse of claim 1, wherein the plurality of second conductive patterns comprise the material that has lower reactivity with oxygen than does the material of the plurality of first conductive patterns.

4. The fuse of claim 1, wherein the plurality of second conductive patterns comprise the material that has lower ion mobility than does the material of the plurality of first conductive patterns.

5. The fuse of claim 1, wherein the plurality of first conductive patterns and the plurality of second conductive patterns comprise metal layers.

6. The fuse of claim 1, wherein the plurality of first conductive patterns comprise a copper layer.

7. The fuse of claim 6, wherein the plurality of second conductive patterns comprise a tungsten layer.

8. The fuse of claim 1, further comprising:
a capping layer covering the plurality of first conductive patterns and the plurality of second conductive patterns.

9. The fuse of claim 8, wherein the capping layer comprises a nitride layer.

10. The fuse of claim 1, further comprising:
a dielectric layer covering a surface of a structure including the plurality of first conductive patterns and the plurality of second conductive patterns, and defining a fuse box over a part of the plurality of first conductive pattern between the plurality of second conductive patterns.

* * * * *